(12) United States Patent
Nam (10) Patent No.: US 7,182,876 B2  
(45) Date of Patent: Feb. 27, 2007

(54) CANTILEVER MICROSTRUCTURE AND FABRICATION METHOD THEREOF

(75) Inventor: Hyo-Jin Nam, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/936,892

(22) Filed: Sep. 8, 2004

(65) Prior Publication Data

US 2005/0051515 A1   Mar. 10, 2005

(30) Foreign Application Priority Data

Sep. 8, 2003 (KR) .................. 10-2003-0062508

(51) Int. Cl.
*H01L 21/00* (2006.01)

(52) U.S. Cl. .............. 216/2; 216/41; 216/79; 438/717; 438/719

(58) Field of Classification Search .......... 216/2, 216/74, 77, 79; 438/717, 719
See application file for complete search history.

(56) References Cited

U.S. PATENT DOCUMENTS

| | | | | |
|---|---|---|---|---|
| 4,968,585 A | * | 11/1990 | Albrecht et al. | ............ 430/320 |
| 5,066,358 A | * | 11/1991 | Quate et al. | .................... 216/2 |
| 5,399,232 A | * | 3/1995 | Albrecht et al. | ................ 216/2 |
| 6,066,265 A | * | 5/2000 | Galvin et al. | ................... 216/2 |
| 6,227,519 B1 | * | 5/2001 | Yagi et al. | ............... 249/114.1 |
| 6,328,902 B1 | * | 12/2001 | Hantschel et al. | ............. 216/2 |

* cited by examiner

*Primary Examiner*—Shamim Ahmed
(74) *Attorney, Agent, or Firm*—Lee, Hong, Degerman, Kang & Schmadeka

(57) ABSTRACT

In the present invention, disclosed are a cantilever microstructure and a fabrication thereof comprising a base plate; a cantilever beam extended from one surface of the base plate to outside so that a part thereof can be suspended, and formed of a silicon nitride material, and a probing tip formed at a front end of one surface of the cantilever beam, whereby the thickness of the cantilever beam becomes uniform and the mechanical and electrical characteristic thereof are improved.

8 Claims, 5 Drawing Sheets

CANTILEVER MICROSTRUCTURE AND FABRICATION METHOD THEREOF

BACKGROUND OF THE INVENTION

1. Field of the Invention

The present invention relates to a cantilever microstructure and a fabrication method thereof, and more particularly, to a cantilever microstructure including a cantilever beam having an excellent mechanical and electric characteristic, and a fabrication method thereof.

2. Description of the Conventional Art

An atomic force microscopy that is fast being developed not only measures a surface topology of a sample by a resolution of a nanometer as an atomic level, but also detects its electrical or magnetic characteristic.

Based on a high resolution of the atomic force microscopy, an information recording/reproducing device with a density more than Tbit/in$^2$ is being actively developed. Also, a lithography device of an ultra-high resolution is being briskly developed.

In the atomic force microscopy, the information recording/reproducing device, and the lithography device, the most core component for realizing a resolution of a nanometer is a cantilever microstructure fabricated by a micro-machining technology.

Figure 1:
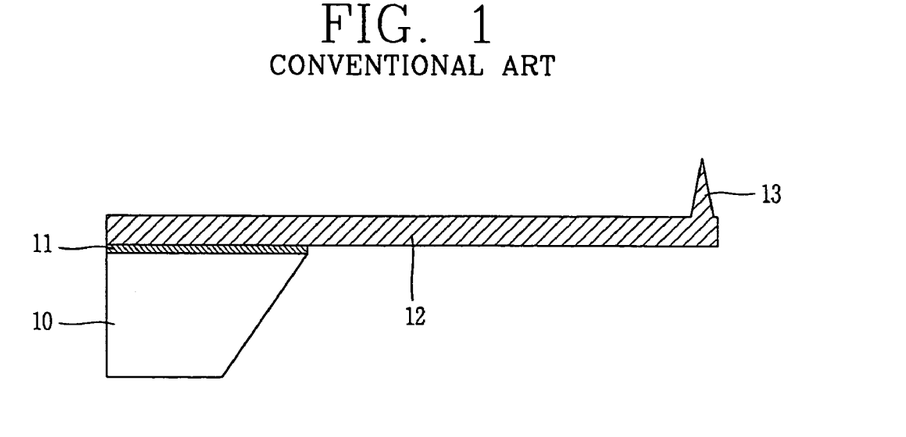
FIG. 1 is a sectional view showing one embodiment of a cantilever microstructure used in an atomic force microscopy in accordance with the conventional art.

FIG. 1 is a sectional view showing one embodiment of a cantilever microstructure used in an atomic force microscopy in accordance with the conventional art.

As shown, the conventional cantilever microstructure used in an atomic force microscopy comprises: a base plate 10 formed of a silicon material; a silicon oxide layer 11 formed at one surface of the base plate 10; a cantilever beam 12 extended from one surface of the silicon oxide layer 11 to outside so that a part thereof can be suspended; and a probing tip 13 formed at a front end of one surface of the cantilever beam 12.

The cantilever beam 12 is formed by patterning a substrate formed of a silicon material, and the probing tip 13 is also formed of a silicon material.

Operation of the conventional atomic force microscopy to which the cantilever microstructure is applied will be explained, especially, with regard to an operation of the cantilever microstructure as follows.

When the probing tip 13 formed at the front end of the cantilever beam 12 becomes close to a sample, the cantilever beam 12 is bent by an atomic force between the probing tip and the sample.

In order to measure the up-down bending of the cantilever beam 12, laser is irradiated on the cantilever beam 12. An angle of a reflected laser is measured from an upper surface of the cantilever beam 12 by using a photo diode.

A signal measured by the photo diode is fed back to a piezoelectric tube thus to uniformly maintain an interval between the end of the probing tip 13 and the sample. Also, a shape of the sample can be detected by measuring a voltage applied to the piezoelectric tube.

Figure 2:
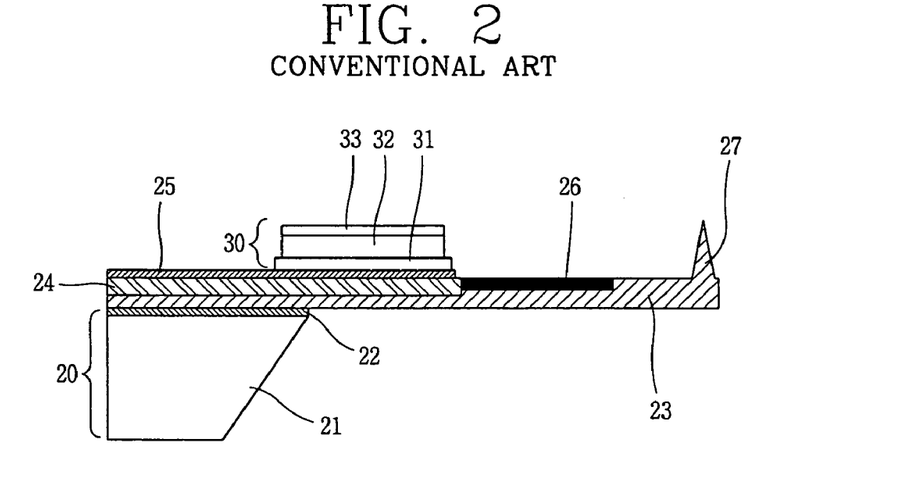
FIG. 2 is a sectional view showing another embodiment of the cantilever microstructure used in an atomic force microscopy in accordance with the conventional art.

FIG. 2 is a sectional view showing another embodiment of the cantilever microstructure used in an atomic force microscopy in accordance with the conventional art.

As shown, the conventional cantilever microstructure used in an atomic force microscopy according to another embodiment comprises: a base plate 20 composed of a silicon layer 21 and a silicon oxide layer 22; a cantilever beam 23 extended from one surface of the base plate 20 to outside so that a part thereof can be suspended; a silicon oxide layer 25 formed at one surface of the cantilever beam 23; a piezoelectric actuator 30 formed on the silicon oxide layer 25 and the piezoelectric actuator 30 comprises a lower electrode 31, a piezoelectric layer 32, and an upper electrode 33; a heavily-doped portion 24 formed at a region of the cantilever beam 23 where the silicon oxide layer 25 is formed; a piezo-resistive sensor 26 formed at one side of the cantilever beam 23 to be electrically connected to the heavily-doped portion; and a probing tip 27 formed at a front end of one surface of the cantilever beam 23.

The cantilever beam 23 is formed by pattering a silicon substrate, and the probing tip 27 is also formed by pattering the silicon substrate.

An operation speed of the cantilever microstructure used in an atomic force microscopy according to another embodiment of the conventional art is increased by a driving of the piezoelectric actuator 30, and thereby a sample analyzing speed of the atomic force microscopy becomes fast.

Also, in order to implement an information recording/reproducing device having a higher resolution and a lithography device, an array of the cantilever microstructure is used.

However, since the cantilever beam is formed by patterning a silicon substrate using a etching technique, it is hard to make the cantilever beam have an uniform thickness. Moreover, a thickness of an SOI (Silicon on Insulator) wafer used to fabricate the cantilever microstructure is itself uneven, and then it is more difficult to maintain the entire uniform thickness of the cantilever beam at the time of etching process.

According to this, the thickness deviation of ±5% of the cantilever beam cannot be easily obtained, as well as a stress is not uniformly distributed on the entire cantilever beam thereby to have a high possibility to cause an error at the time of operating the cantilever beam.

Also, in case of arraying cantilever beams having uneven thickness in order to use in an information recording device or a lithography device, a thickness, a height, and a force of each cantilever beam are uneven thereby to generate a severe problem in operation.

Since the cantilever beam has an uneven thickness and is formed of a silicon material having a brittle characteristic, it can be easily destroyed by repetitive fatigue loads.

In the conventional cantilever microstructure having a piezoelectric actuator and a piezo-resistive sensor in order to increase an operation speed, when a voltage is applied to the piezoelectric actuator at the time of a high speed operation, a silicon oxide layer below the piezoelectric actuator serves as a capacitor and thereby a signal is partly transmitted to the piezo-resistive sensor through the cantilever beam formed of the silicon material and the silicon oxide layer. According to this, an electrical coupling phenomenon that an error is generated at the piezo-resistive sensor is caused.

SUMMARY OF THE INVENTION

Therefore, an object of the present invention is to provide a cantilever microstructure including a cantilever beam having a uniform thickness and an excellent mechanical characteristic and capable of preventing an electrical coupling between a piezo-resistive sensor and a piezoelectric actuator, and a fabrication method thereof.

To achieve these and other advantages and in accordance with the purpose of the present invention, as embodied and broadly described herein, there is provided a cantilever microstructure comprising: a base plate; a cantilever beam extended from one surface of the base plate to outside so that a part thereof can be suspended, and formed of silicon nitride material; and a probing tip formed at a front end of one surface of the cantilever beam.

To achieve these and other advantages and in accordance with the purpose of the present invention, as embodied and broadly described herein, there is also provided a fabrication method of a cantilever microstructure comprising: a first step of bonding two silicon substrates so that at least one silicon nitride layer can be buried between said two silicon substrates; a second step of grinding one of said two silicon substrates with a predetermined thickness; a third step of pattering a probing tip by etching the grinded silicon substrate so as for the silicon nitride layer to be exposed to outside except a part in which the probing tip is formed; a fourth step of patterning a cantilever beam to the exposed silicon nitride layer; and a fifth step of patterning a base plate by etching a part of the remaining silicon substrate and thereby suspending the cantilever beam.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Hereinafter, a cantilever microstructure and a fabrication method thereof according to the present invention will be explained with reference to the attached drawings in more detail.

That is, preferred embodiments of a cantilever microstructure used in an atomic force microscopy and an information recording/reproducing device and a fabrication method thereof will be explained in more detail.

Figure 3:
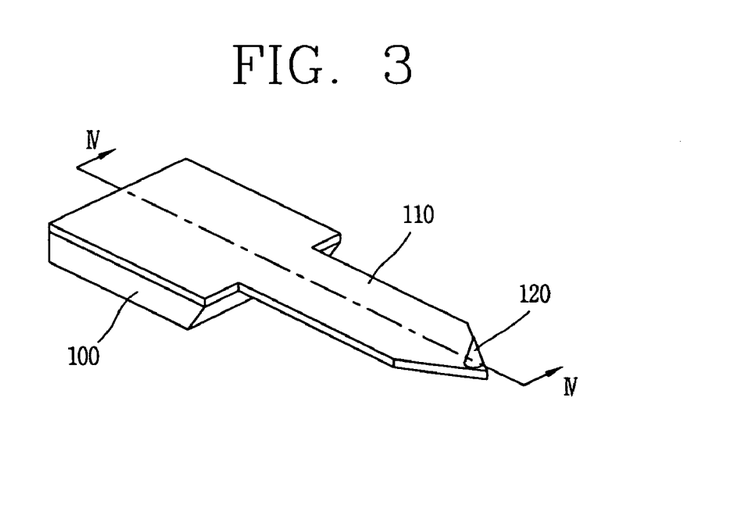
FIG. 3 is a perspective view showing one embodiment of a cantilever microstructure used in an atomic force microscopy according to the present invention.
Figure 4:
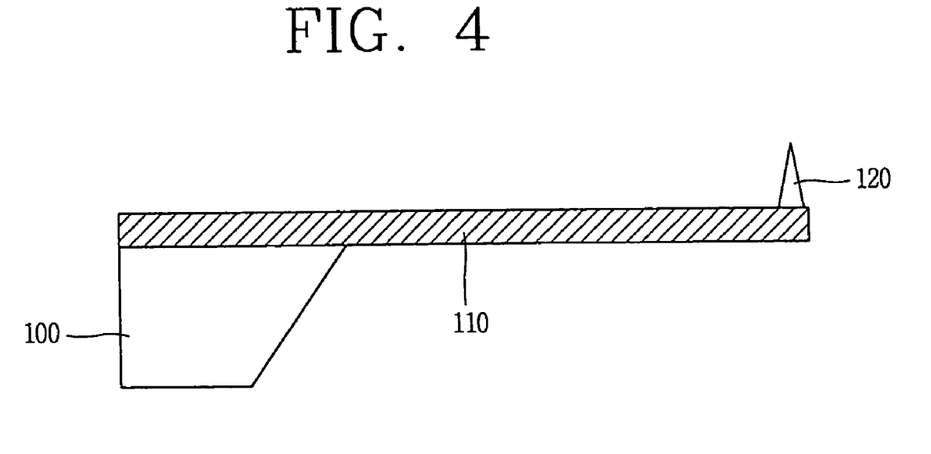
FIG. 4 is a sectional view taken along line IV—IV of FIG. 3.

FIG. 3 is a perspective view showing one embodiment of a cantilever microstructure used in an atomic force microscopy according to the present invention, and FIG. 4 is a sectional view taken along line IV—IV of FIG. 3.

As shown, the cantilever microstructure used in an atomic force microscopy according to one embodiment of the present invention comprises: a base plate 100; and a cantilever beam 110 extended from one surface of the base plate 100 to outside so that a part thereof can be suspended, and formed of a silicon nitride material.

A probing tip 120 is formed at a front end of one surface of the cantilever beam 110 in order to contact a sample of which surface profile is to be detected or to interact with the sample with a certain distance.

The base plate 100 is formed by patterning a silicon substrate, and thereby the base plate 100 is preferably formed of a silicon material.

The silicon nitride material preferably contains excessive silicon rather than the stoichiometric compound of the known composition such as $Si_3N_4$ in order to minimize a remaining stress of the cantilever beam 110. It is also possible to use a silicon nitride material having a different silicon/nitrogen composition ratio as the compound of the cantilever beam 110.

By using the silicon nitride material, the cantilever beam 110 can be formed so as to have a uniform thickness.

Even if an operation principle of the cantilever microstructure used in an atomic force microscopy according to one embodiment of the present invention is equal to that of the conventional cantilever microstructure, the cantilever beam of the present invention has more excellent uniformity of thickness than the conventional cantilever beam since the cantilever beam of the present invention is formed of a silicon nitride material. Also, the cantilever microstructure of the present invention has an excellent mechanical characteristic not for the cantilever beam 110 to be easily destroyed, thereby having a greater reliability.

Hereinafter, a cantilever microstructure used in an atomic force microscopy according to another embodiment of the present invention will be explained in more detail.

Figure 5:
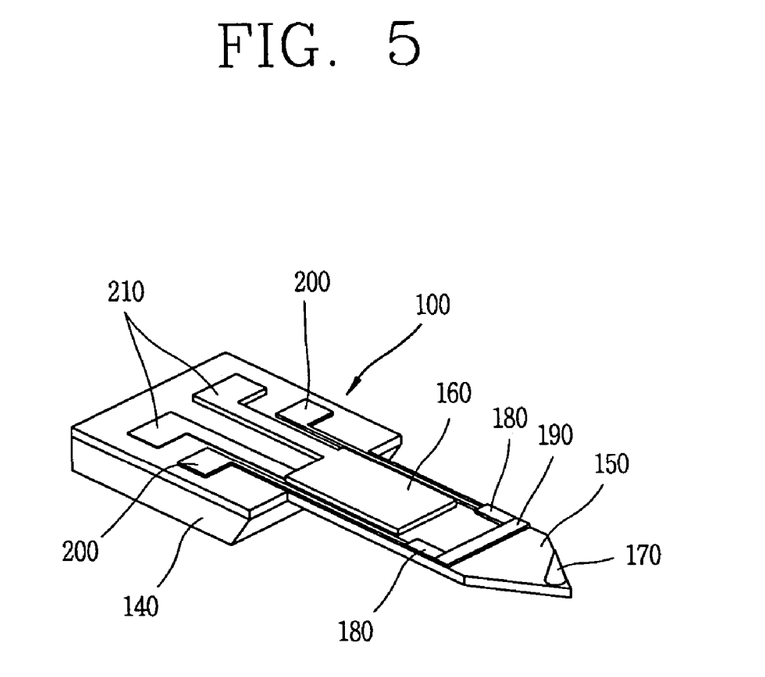
FIG. 5 is a perspective view showing another embodiment of the cantilever microstructure used in an atomic force microscopy according to the present invention.

FIG. 5 is a perspective view showing another embodiment of the cantilever microstructure used in an atomic force microscopy according to the present invention.

As shown, the cantilever microstructure according to another embodiment of the present invention comprises: a base plate 140; a cantilever beam 150 extended from one surface of the base plate 140 to outside so that a part thereof can be suspended, and formed of a silicon nitride material; a piezoelectric actuator 160 formed at one surface of the cantilever beam 150; a probing tip 170 formed at a front end of one surface of the cantilever beam 150; and a piezo-resistive sensor 180 formed at both sides of one surface of the cantilever beam 150 between the piezoelectric actuator 160 and the probing tip 170.

The piezo-resistive sensor 180 is formed as a doped-silicon thin film patterned on the cantilever beam 150.

One side of the piezo-resistive sensor 180 is connected to a heavily doped region 190 on a silicon thin film patterned on the cantilever beam 150, and another side thereof is connected to an electrode terminal 200 formed at a rear end of one surface of the cantilever beam. An unexplained reference numeral 210 denotes an electrode terminal of the piezoelectric actuator.

The base plate 140 is formed of a silicon material.

The silicon nitride material preferably contains excessive silicon rather than the stoichiometric compound of the known composition such as $Si_3N_4$ in order to minimize a remaining stress of the cantilever beam 150. It is also possible to use a silicon nitride material having a different silicon/nitrogen composition ratio as the compound of the cantilever beam 150.

By using the silicon nitride material, the cantilever beam 150 can be patterned so as to have a uniform thickness.

In the cantilever microstructure used in an atomic force microscopy according to another embodiment of the present invention, the cantilever beam 150 is formed of the silicon nitride material thereby to have more excellent uniformity of thickness. Also, the cantilever microstructure of the present invention has an excellent mechanical characteristic, a characteristic not for the cantilever beam to be easily destroyed, thereby having a greater reliability.

Also, since the cantilever beam 150 provided with the piezoelectric actuator 160 is formed of the silicon nitride material, even if the cantilever microstructure is operated with a high speed by its own driving force as a voltage is applied to the piezoelectric actuator 160, an electrical coupling phenomenon that causes an error to a signal outputted from the piezo-resistive sensor 180 as the voltage applied to the piezoelectric actuator 160 is transmitted to the piezo-resistive sensor 180 is not generated.

Hereinafter, a cantilever microstructure used in a thermo-mechanical type of information recording/reproducing device according to the present invention will be explained in more detail.

Figure 6:
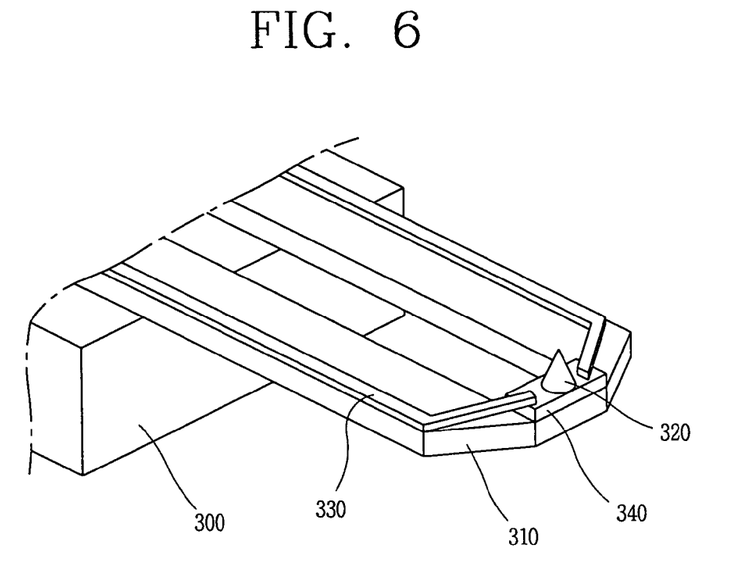
FIG. 6 is a perspective view showing a cantilever microstructure used in a thermo-mechanical type of information recording/reproducing device according to the present invention.

FIG. 6 is a perspective view showing a cantilever microstructure used in a thermo-mechanical type of information recording/reproducing device according to the present invention.

As shown, the cantilever microstructure used in a thermo-mechanical probing tip type information recording/reproducing device according to the present invention comprises: a base plate 300; and a cantilever beam 310 extended from one surface of the base plate 300 to outside so that a part thereof can be suspended, and formed of a silicon nitride material.

A probing tip 320 is formed at a front end of one surface of the cantilever beam 310 for reading and writing information at the front end thereof and the cantilever beam 310 is diverged into two from a front end of one surface thereof at which the probing tip 320 is formed.

A metal electrode 330 is formed at one side of each divergence. Also, a heater platform 340 for electrically connecting the metal electrode 330 and the probing tip 320 is formed between the probing tip 320 and the front end of one surface of the cantilever beam 310.

Also, the base plate 300 is formed of a silicon material.

The silicon nitride material preferably contains excessive silicon rather than the stoichiometric compound of the known composition such as $Si_3N_4$ in order to minimize a remaining stress of the cantilever beam 310. It is also possible to use a silicon nitride material having a different silicon/nitrogen composition ratio as the compound of the cantilever beam 310.

The probing tip 320 is formed of a silicon, and boron (B) or phosphate (P) is doped as a dose concentration corresponding to approximately $5 \times 10^{14}$ cm$^{-2}$ in order to use the probing tip 320 as a resistive heater.

The heater platform 340 is formed of a silicon material, and B or P is doped as a high dose concentration corresponding to approximately $1 \times 10^{16}$ cm$^{-2}$ in order to minimize a contact resistance with the metal electrode 330.

Operation of the cantilever microstructure used in a thermo-mechanical type of information recording/reproducing device according to the present invention will be explained in brief.

When a current is applied to the metal electrode 330, the probing tip 320, a resistive heater formed at an upper end of the heater platform 340 is heated. The heated probing tip 320 makes a hole at a recording medium formed of a polymer material thereby to record information.

The recorded information is reproduced by detecting a thermal conductivity difference between the probing tip 320 and the recording medium. That is, since a thermal conductivity between the probing tip 320 and the recording medium where the hole is formed is different from a thermal conductivity between the probing tip 320 and the recording medium where the hole is not formed, a resistance value of the probing tip 320 is varied. By measuring the varied resistance value of the probing tip 320, the recorded information is reproduced.

Also, since the cantilever beam 310 is formed of a silicon nitride material, the cantilever beam has an excellent uniformity of thickness and an excellent mechanical characteristic that the cantilever bean 310 is not easily destroyed. According to this, a thickness and a height of the cantilever beam are uniform even in case of fabricating a cantilever microstructure array, thereby having a great reliability.

Hereinafter, a cantilever microstructure used in a thermo-piezoelectric type of information recording/reproducing device according to the present invention will be explained in brief.

Figure 7:
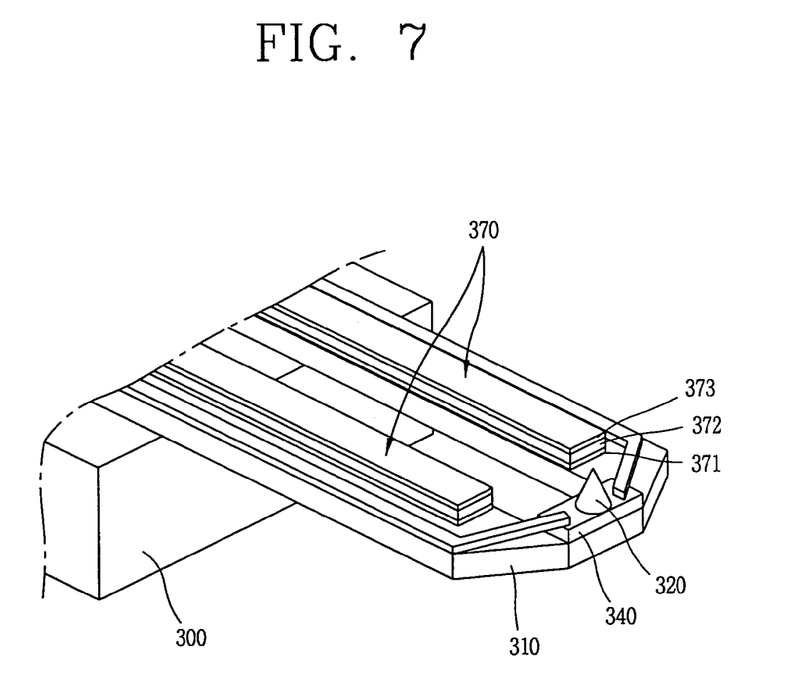
FIG. 7 is a perspective view showing a cantilever microstructure used in a thermo-piezoelectric type of information recording/reproducing device according to the present invention.

FIG. 7 is a perspective view showing a cantilever microstructure used in a thermo-piezoelectric probing tip type information recording/reproducing device according to the present invention.

An explanation of the same structure as the cantilever microstructure used in the thermo-mechanical type of information recording/reproducing device according to the present invention will be omitted, and the same reference numerals will be given to the same parts.

As shown, the cantilever microstructure used in the thermo-piezoelectric type of information recording/reproducing device of the present invention is further provided with a piezoelectric sensor 370 at the cantilever microstructure used in the thermo-mechanical type of information recording/reproducing device shown in FIG. 6.

That is, the piezoelectric sensor 370 is formed at each one surface of the cantilever beam 310 that is diverged into two.

The piezoelectric sensor 370 is a piezoelectric capacitor comprising: a lower electrode layer 371 contacting one side of the cantilever beam 310; a piezoelectric layer 372 formed on the lower electrode layer 371; and an upper electrode layer 373 formed on the piezoelectric layer 372.

Here, a silicon oxide layer is preferably formed between the lower electrode layer and one surface of the cantilever beam thus to prevent a chemical reaction between the cantilever beam and the piezoelectric material of the piezoelectric layer.

Also, the cantilever beam 310 is formed of a nitride of the silicon that constitutes the base plate 300 like the cantilever microstructure shown in FIG. 6.

Likewise, the silicon nitride material preferably contains excessive silicon rather than the stoichiometric compound of the known composition such as $Si_3N_4$ in order to minimize a remaining stress of the cantilever beam 310. It is also possible to use a silicon nitride material having a different silicon/nitrogen composition ratio as the compound of the cantilever beam 310.

Operation of the cantilever microstructure used in a thermo-piezoelectric type of information recording/reproducing device according to the present invention will be explained in brief as follows.

In order to record information at a polymer recording medium, the probing tip 320 is heated thus to make a hole at the polymer recording medium like in the thermo-mechanical type of information recording/reproducing device. Also, in order to reproduce information, a bending degree of the cantilever beam 310 according to whether a hole is formed or not is measured by the piezoelectric sensor 370.

Since the cantilever microstructure has a multi-layer structure composed of the cantilever beam 310 and the piezoelectric sensor 370 formed at one surface of the cantilever beam 310, it is important for the cantilever beam 310 to have a uniform thickness in order to maintain a constant initial bending degree thereof.

Since the cantilever beam 310 is formed of a silicon nitride material, a thickness thereof is uniform and thereby the initial bending degree of the cantilever beam 310 can be constantly maintained.

The cantilever microstructure according to the present invention can be applied not only to the aforementioned preferred embodiments but also to any device in which the cantilever microstructure is used.

Hereinafter, a fabrication method of the cantilever microstructure according to the present invention will be explained in more detail.

The cantilever microstructure according to the present invention can be variously applied, and a few additional components are required when necessary. However, the basic components of the cantilever microstructure are a base plate and a cantilever beam formed at the base plate.

Therefore, a fabrication method of the basic components of the cantilever microstructure according to the present invention will be explained.

FIGS. 8 to 12 are sectional views showing a fabrication process of the cantilever microstructure according to the present invention.

As shown, a fabrication method of a cantilever microstructure according to the present invention comprises: a first step of bonding two silicon substrates 400 and 500 so that at least one silicon nitride layer 410 can be buried between said two silicon substrates 400 and 500 (Refer to FIGS. 8 and 9); a second step of grinding one of said two silicon substrates 400 and 500 with a predetermined thickness (Refer to FIG. 10); a third step of patterning a probing tip 430 by etching the grinded silicon substrate 400 so as for the silicon nitride layer 410 to be exposed to outside except a part in which the probing tip 430 is formed (Refer to FIG. 11); a fourth step of patterning a cantilever beam 440 to the exposed silicon nitride layer 410 (Refer to FIG. 11); and a fifth step of patterning a base plate 530 by etching a part of the remaining silicon substrate 500 and thereby suspending the cantilever beam 440.

Figure 8:
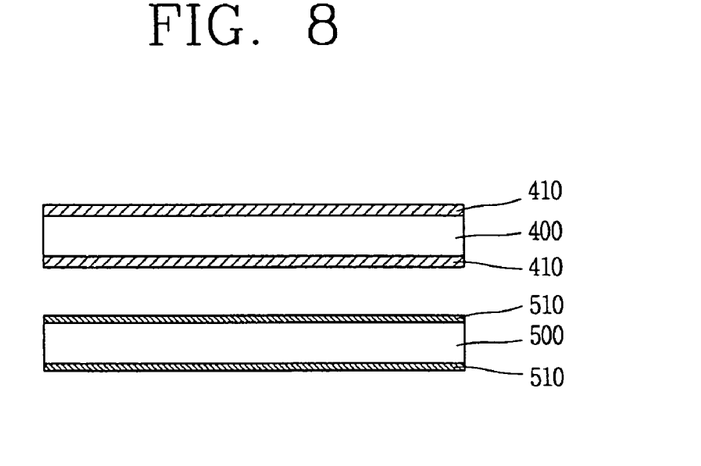
FIGS. 8 to 12 are sectional views showing a fabrication process of the cantilever microstructure according to the present invention.
Figure 9:
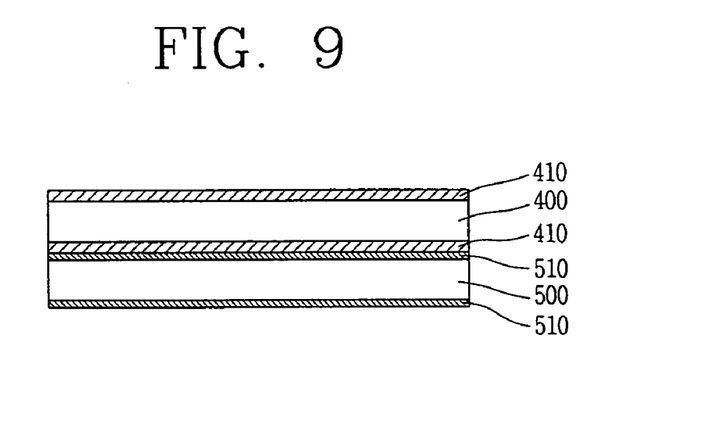
Figure 10:
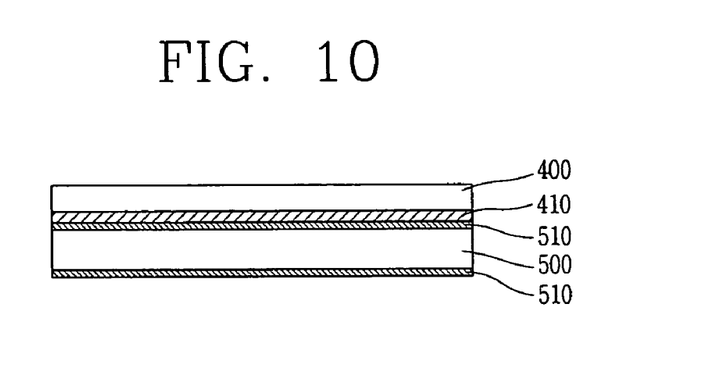

In the first step, at least one of said two silicon substrates 400 and 500 is provided with the silicon nitride layer 410 at both surfaces thereof, and the other silicon substrate 500 rather than the silicon substrate 400 where the silicon nitride layer 410 is formed can be provided with a silicon nitride layer or a silicon oxide layer as a deposition layer 510 at both sides thereof. Also, both surfaces of the silicon substrate 500 can be also in a bare state that no layer is formed.

When said two silicon substrates 400 and 500 are bonding each other, at least one silicon nitride layer is buried therebetween.

The silicon nitride layer formed at both surfaces of at least one substrate of said two substrates 400 and 500 is preferably deposited by a chemical vapor deposition (CVD) method.

More preferably, it is advisable that the silicon nitride layer is deposited by LPCVD (Low Pressure Chemical Vapor Deposition) method, thereby to have more excellent mechanical characteristic as well as to be able to make the cantilever beam 440 have <1% of its thickness deviation.

Figure 11:
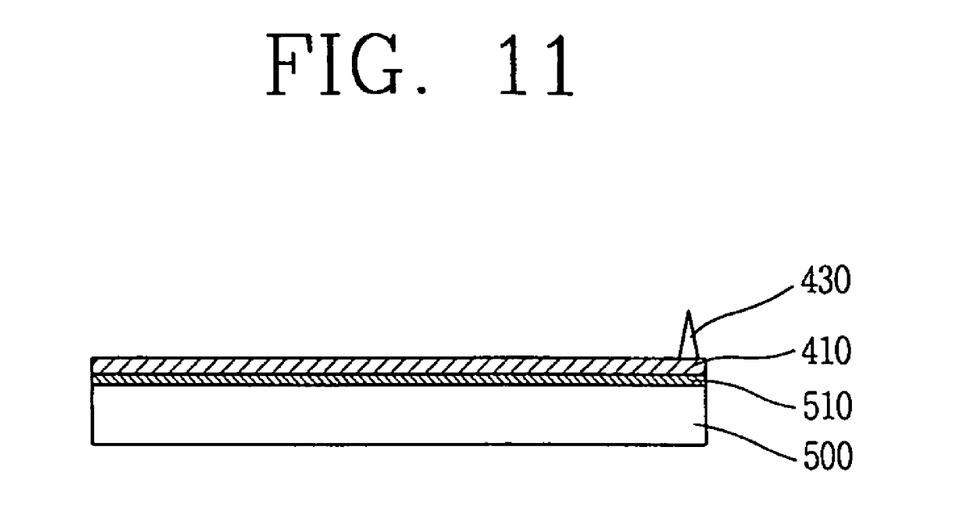

The silicon nitride layer preferably contains excessive silicon rather than the stoichiometric compound of the known composition such as $Si_3N_4$ in order to minimize a remaining stress of the cantilever beam 440. It is also possible to use a silicon nitride layer with a different silicon/nitrogen composition ratio as the cantilever beam 440.

The silicon oxide layer is preferably deposited by a chemical vapor deposition method or by a thermal oxidation method.

Preferably, said two substrates 400 and 500 are respectively cleaned by $H_2SO_4$, and then are bonding to each other at a temperature of 1100° C.

Figure 12:
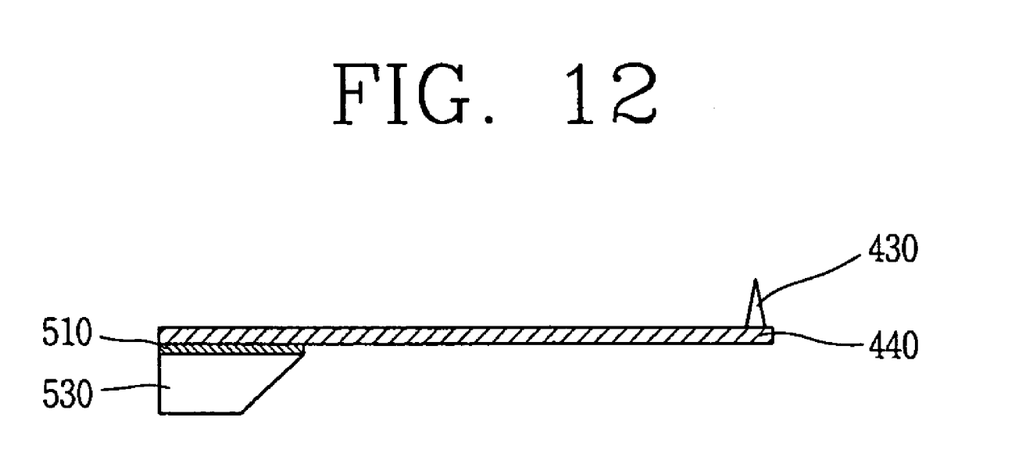

Meanwhile, in case that both surfaces of the silicon substrate 500 that is bonding to the silicon substrate 400 where the silicon nitride layer 410 is formed are deposited by a silicon oxide layer 510, it is advisable that the base plate 530 is patterned and at the same time the exposed silicon oxide layer 510 is removed in the fifth step.

As aforementioned, in the cantilever microstructure according to the present invention, the cantilever beam is formed of a nitride of a silicon constituting the base plate, thereby to have a uniform thickness.

Also, since the compound of the silicon nitride layer contains excessive silicon, a remaining stress of the cantilever beam is minimized and the cantilever beam has a stable mechanical characteristic that the cantilever beam is not easily destroyed by a repetitive fatigue loads.

Moreover, in case of fabricating a cantilever microstructure array in order to be used in an information recording/reproducing device and a lithography device, a thickness and a height of a cantilever beam array of the cantilever microstructure are uniform. According to this, an entire function of the cantilever array system is enhanced, and thereby functions of the information recording/reproducing device and the lithography device are also enhanced.

Additionally, in case of applying a cantilever beam formed of a silicon nitride material to a self-driven type cantilever microstructure where a piezo-resistive sensor and a piezoelectric actuator are integrated, an electric coupling problem between the piezo-resistive sensor and the piezoelectric actuator can be solved.

Also, it is possible to massively produce a cantilever microstructure of a high quality having the same size at a wafer level.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A fabrication method of a cantilever microstructure comprising:
   a first step of bonding two silicon substrates so that at least one silicon nitride layer can be buried between said two silicon substrates;
   a second step of grinding one of said two silicon substrates with a predetermined thickness;
   a third step of patterning a probing tip by etching the grinded silicon substrate so as for the silicon nitride layer to be exposed to outside except a part in which the probing tip is formed;
   a fourth step of patterning a cantilever beam to the exposed silicon nitride layer; and
   a fifth step of patterning a base plate by etching a part of the remaining silicon substrate and thereby suspending the cantilever beam.

2. The method of claim 1, wherein in the first step, at least one of said two silicon substrates is provided with a silicon nitride layer at both surfaces thereof.

3. The method of claim 2, wherein the other silicon substrate rather than the silicon substrate where the silicon nitride layer is formed can be provided with a silicon nitride layer or a silicon oxide layer, or can be in a bare state that no layer is formed.

4. The method of claim 3, wherein the silicon nitride layer contains excessive silicon rather than the stoichiometric compound of the known composition such as Si3N4 in order to minimize a remaining stress of the cantilever beam.

5. The method of claim 4, wherein the silicon nitride layer is deposited by a low pressure chemical vapor deposition (LPCVD) method.

6. The method of claim 5, wherein the cantilever beam patterned on the silicon nitride layer has <1% of the its thickness deviation.

7. The method of claim 3, wherein the silicon oxide layer is deposited by a chemical vapor deposition method or by a thermal oxidation method.

8. The method of claim 1, wherein in the first step, said two substrates are bonding each other at a temperature of 1100° C.

* * * * *